(12) United States Patent  
Im

(10) Patent No.: US 7,351,625 B2  
(45) Date of Patent: Apr. 1, 2008

(54) RECESSED TRANSISTORS AND METHODS OF FORMING THE SAME

(75) Inventor: Gyong-Sub Im, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 134 days.

(21) Appl. No.: 11/380,470

(22) Filed: Apr. 27, 2006

(65) Prior Publication Data

US 2006/0278935 A1 Dec. 14, 2006

(30) Foreign Application Priority Data

Jun. 10, 2005 (KR) ............... 10-2005-0049965

(51) Int. Cl.
*H01L 21/338* (2006.01)
*H01L 31/62* (2006.01)

(52) U.S. Cl. ................ 438/178; 257/332

(58) Field of Classification Search ........... 438/164, 438/178, 280, 295; 257/282–284, 330, 332, 257/E29.14–E29.161, E29.262, E29.318

See application file for complete search history.

(56) References Cited

U.S. PATENT DOCUMENTS

| | | | | |
|---|---|---|---|---|
| 6,825,526 B1 | 11/2004 | He et al. | ........... | 257/317 |
| 6,852,559 B2 * | 2/2005 | Kwak et al. | ........... | 438/44 |
| 7,205,199 B2 * | 4/2007 | Park et al. | ........... | 438/270 |
| 2005/0035427 A1 | 2/2005 | Park et al. | ........... | 257/510 |

FOREIGN PATENT DOCUMENTS

| | | |
|---|---|---|
| KR | 2005-0002473 | 1/2005 |
| KR | 2005-0026319 | 3/2005 |

OTHER PUBLICATIONS

English language abstract of Korean Publication No. 2005-0002473.
English language abstract of Korean Publication No. 2005-0026319.

* cited by examiner

*Primary Examiner*—Calvin Lee
(74) *Attorney, Agent, or Firm*—Marger Johnson & McCollom, P.C.

(57) ABSTRACT

According to some embodiments of the invention, there is provided recessed transistors without semiconductor substrate fences formed on the sidewalls of a device isolation layer and methods of forming the same. The recessed transistors and methods provide a way of removing the fences of the semiconductor substrate from the sidewalls of the device isolation layer to increase the effective width of a channel region. The recessed transistors and methods include forming the device isolation layer on the semiconductor substrate to isolate an active region. Further, a channel-portion hole is formed in the active region so that the sidewall height of the channel-portion hole is greater in a width direction of the active region than in a length direction thereof. A gate pattern may further be formed across the active region such that it fills the channel-portion hole.

23 Claims, 12 Drawing Sheets

RECESSED TRANSISTORS AND METHODS OF FORMING THE SAME

This patent application claims priority from Korean Patent Application No. 10-2005-49965, filed Jun. 10, 2005, the contents of which are hereby incorporated by reference in their entirety.

BACKGROUND

1. Field of the Invention

The present invention relates to recessed transistors and methods of forming the same, and more particularly, to recessed transistors removed fences of a semiconductor substrate from sidewalls of a device isolation layer and methods of forming the same.

2. Description of Related Art

In recent years, semiconductor devices have been fabricated using a recessed transistor in order to increase the integration density of transistors on the semiconductor device and to overcome the limitations of a design rule. The recessed transistor includes a channel-portion hole, which is disposed between device isolation layers in a semiconductor substrate, and a gate pattern, which fills in the channel-portion hole. In this case, the channel region of the gate pattern filled in the channel-portion hole can have a larger dimension than a channel region of a planar-type gate pattern disposed on a semiconductor substrate.

However, although the gate pattern in the channel-portion hole may have a channel region with a larger dimension as compared to the channel region of the planar-type gate pattern, the recessed transistor is formed to have a fence in the semiconductor substrate on a sidewall of the device isolation layer. The fence of the semiconductor substrate may form a parasitic transistor in the channel of the active region along the sidewall of the device isolation layer during the drive process of the recessed transistor. Accordingly, before the channel region around the channel-portion hole is inverted, the parasitic transistor may invert the fenced-type channel region on the sidewall of the device isolation layer, thus lowering the current driving capability of the recessed transistor.

U.S. Pat. No. 6,825,526 to Yue-Song He et al. (the '526 patent) discloses a structure for increasing drive current in a memory array and related method. According to the '526 patent, the structure and method include forming insulation regions disposed in a semiconductor substrate, and forming a trench and a tunnel oxide layer, which covers the trench between the insulation regions. Thereafter, a channel region is formed below the tunnel oxide layer.

However, the structure and method disclosed in the Yue-Song He patent do not provide an effective way to further increase the dimension of the channel region while further reducing the design rule. This is because the trench can not simultaneously overcome a design rule between the insulation regions and increase a drive current in a memory array. This is in part because the channel region is restricted by the design rule between the insulation regions and formed in the semiconductor substrate adjacent to the trench. Accordingly, the structure and related method cannot continuously increase the drive current in the memory array while reducing the design rule.

SUMMARY

According to some embodiments of the invention, a semiconductor device in which the fence or fence region of a semiconductor substrate is removed from the sidewall of a device isolation layer in a width direction of an active region is provided. Embodiments of methods of forming these semiconductor devices are also provided.

In one embodiment of the present invention, a recessed transistor includes an active region, which is defined by a device isolation layer in a semiconductor substrate. A channel-portion hole extends to a predetermined depth from a top surface of the active region toward a bottom portion thereof. The device isolation layer is disposed to isolate the active region that surrounds the channel-portion hole in a length direction of the active region. Also, the device isolation layer is disposed to expose at least one first lateral surface of the semiconductor substrate in the channel-portion hole in a width direction of the active region. Further, the length of the first lateral surface may be different from the length of a second lateral surface that is connected to the first lateral surface and in contact with the device isolation layer.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRPTION

Figure 1:
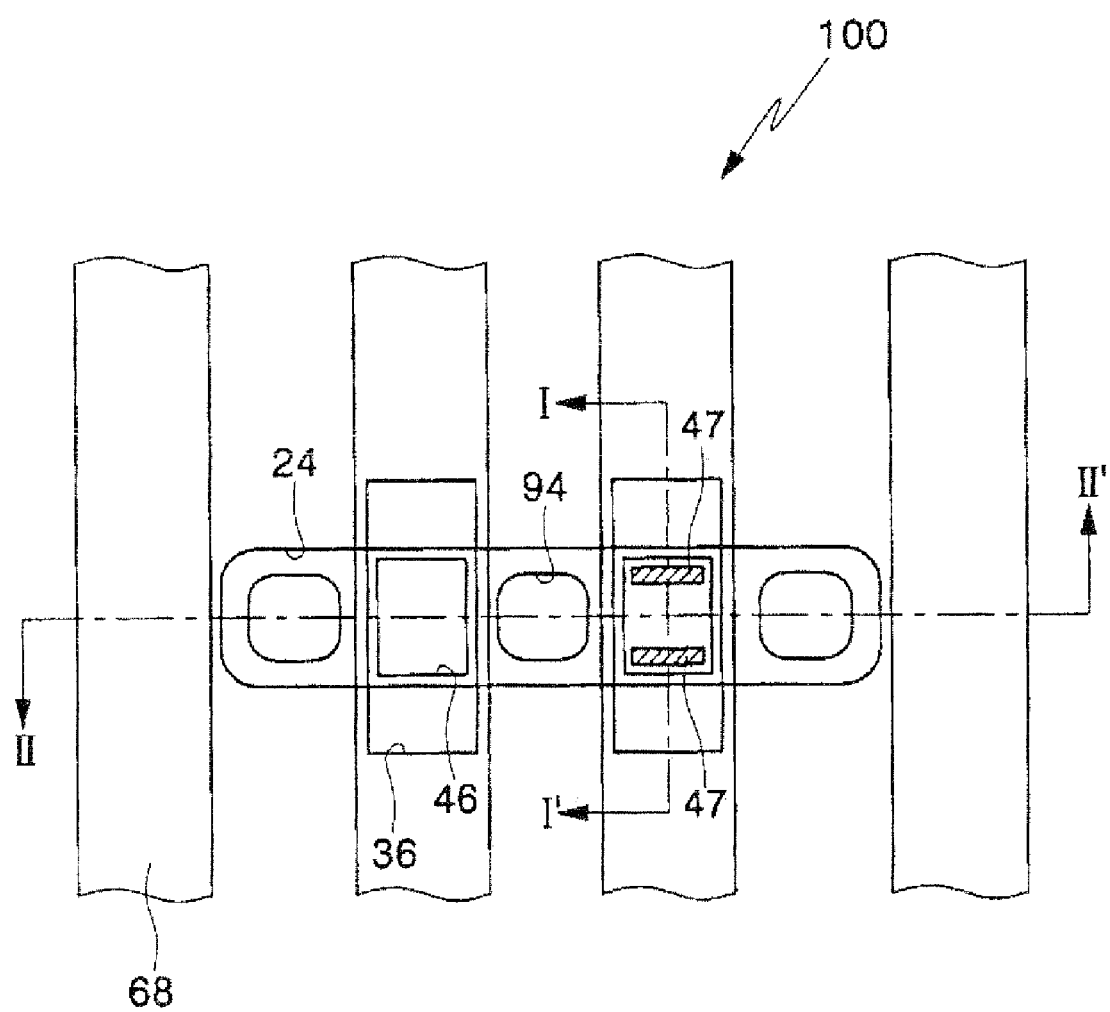
FIG. 1 is a layout view showing a transistor according to an embodiment of the present invention.
Figure 2:
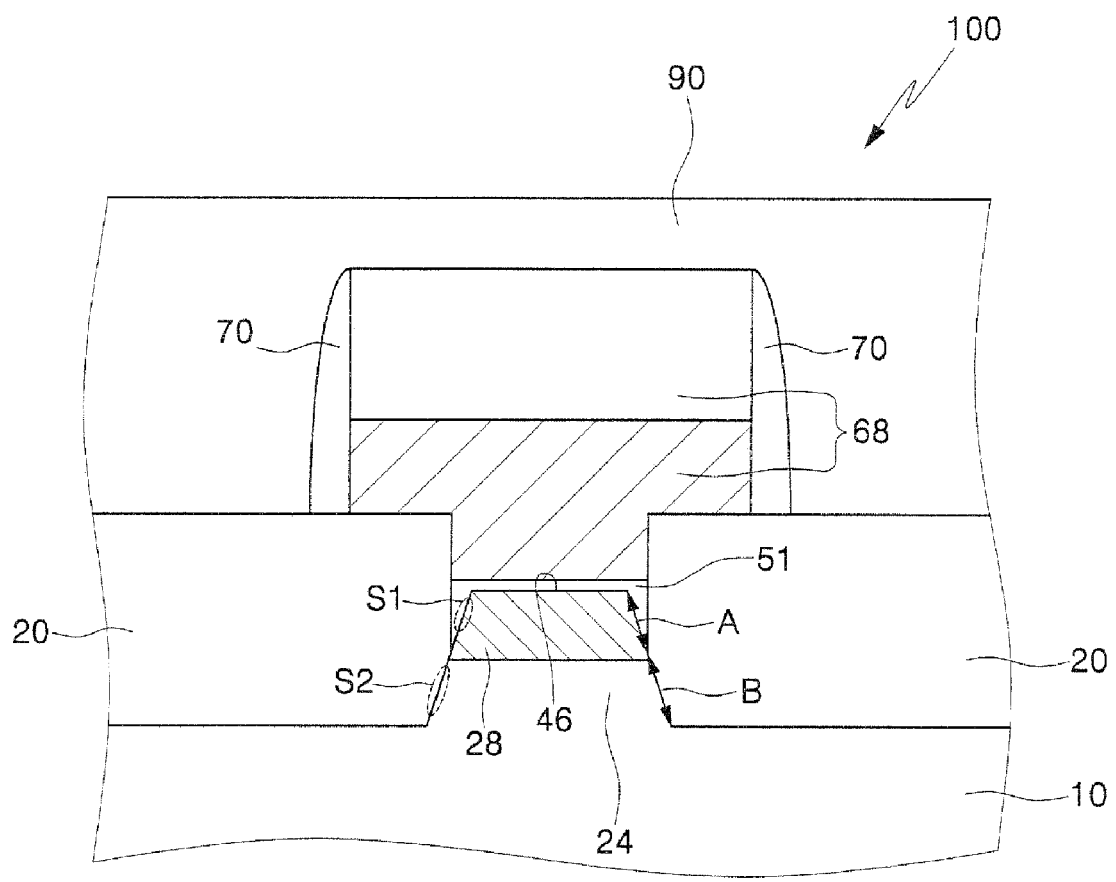
FIGS. 2 and 3 are cross-sectional views showing the transistor illustrated in FIG. 1 taken along lines I-I' and II-II' of FIG. 1, respectively.
Figure 3:
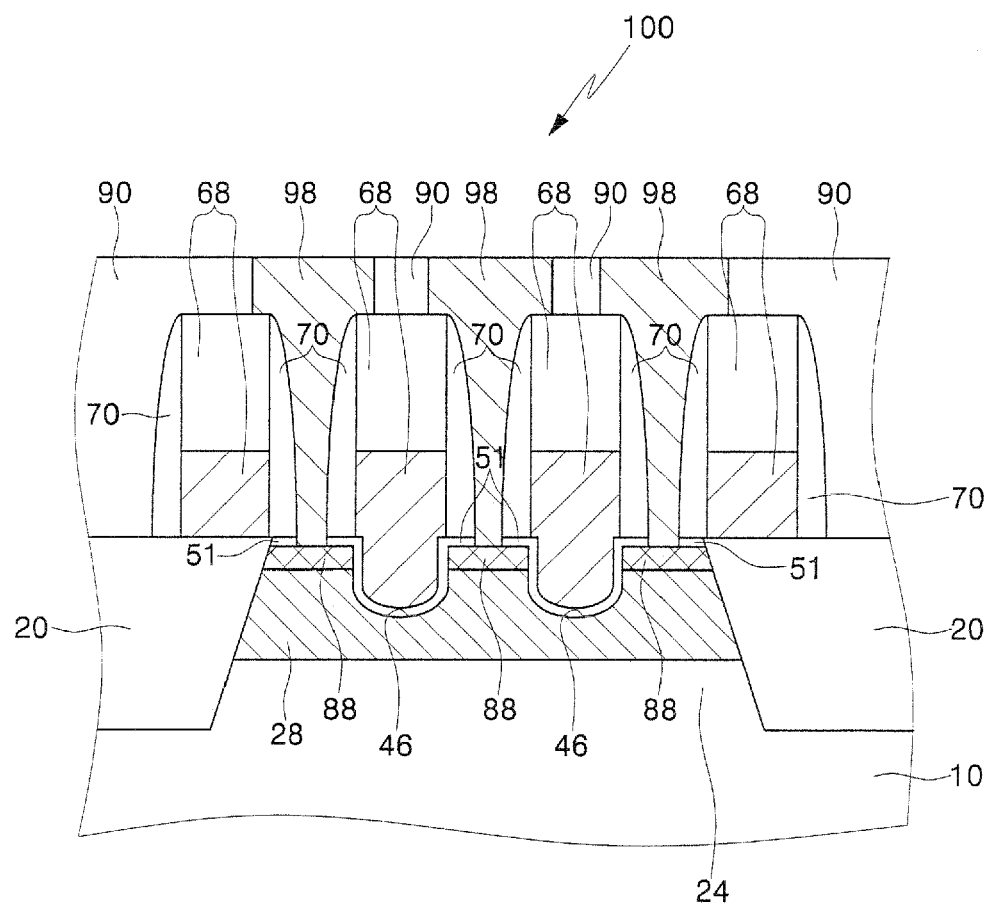

FIG. 1 is a layout view showing a transistor according to an embodiment of the present invention, and FIGS. 2 and 3 are cross-sectional views showing the transistor illustrated in FIG. 1 taken along lines I-I' and II-II' of FIG. 1, respectively. References to the width direction of the active region refer to elements or interactions that occur with reference to the cross-section of the active region illustrated in the view taken along line I-I' of FIG. 1. On the other hand, references to the length direction of the active region refer to elements or interactions that occur with reference to the cross-section of the active region illustrated in the view taken along line II-II' of FIG. 1. The width direction may also relate to the smaller dimension of the active region.

Referring to FIGS. 1 through 3, channel-portion holes 46 are disposed in a semiconductor substrate 10. The channel-portion holes 46 extend to a predetermined depth from a top surface of the semiconductor substrate 10 toward a bottom surface thereof. A device isolation layer 20 is disposed in the semiconductor substrate 10 to define an active region 24. In this case, the device isolation layer 20 is disposed to isolate the active region 24. The active region 24 can be formed to surround the channel-portion holes 46. The device isolation layer 20 may be disposed to expose one of the lateral surfaces S1 of the semiconductor substrate 10 located in the channel-portion holes 46 of the active region 24.

The relationship between the position of the device isolation layers 20 and the position of the channel-portion holes 46 will now be described in more detail. Each of the channel-portion holes 46 is interposed between the device isolation layers 20 and exposes the lateral surfaces S1 of the semiconductor substrate 10 in the active region 24 according to the width direction of the active region 24, as shown in FIG. 2. Also, each of the channel-portion holes 46 may be defined by the semiconductor substrate 10 in the active region 24 and may be surrounded by the device isolation layer 20, as shown in FIG. 3. The semiconductor substrate 10 may contain p-type impurity ions.

The lateral surfaces S1 of the semiconductor substrate 10 in the active region 24 may be defined by length A, as shown in FIG. 2. The active region 24 may additionally include lateral surfaces S2, which may be located below lateral surfaces S1 and in contact with the device isolation layer 20. Lateral surfaces S2 may further be defined by length B, as shown in FIG. 2. In some embodiments, length A of the lateral surfaces S1 may be different than length B of the lateral surfaces S2. Additionally, in some embodiments, length A of the lateral surfaces S1 may be shorter than length B of the lateral surfaces S2. Alternatively, in other embodiments, length A of the lateral surfaces S1 may be equal to or longer than the length B of the lateral surfaces S2.

Furthermore, the length of the width of the semiconductor substrate 10 at the bottom of the channel-portion hole 46 may be different from the length A of the lateral surface S1 of the semiconductor substrate 10 in the active region 24. In some embodiments, the width of the semiconductor substrate 10 at the bottom of the channel-portion hole 46 may be longer than the length A of the lateral surface S1 of the semiconductor substrate 10, while in other embodiments, the width of the semiconductor substrate 10 at the bottom of the channel-portion hole 46 may be equal to or shorter than the length A of the lateral surface S1 of the semiconductor substrate 10.

A channel region 28 may be disposed in the semiconductor substrate 10 to surround the channel-portion holes 46, as shown in FIG. 3. The channel region 28 may have the same conductivity type as the semiconductor substrate 10. Source and drain regions 88 may be disposed in the channel region 28. Each of the source and drain regions 88 may be disposed to contact the top surface of the semiconductor substrate 10 and may further be disposed around the channel-portion holes 46. The source and drain regions 88 may also have a different conductivity type from that of the channel region 28.

Gate patterns 68 may be disposed on the semiconductor substrate 10 and may fill at least a portion of the channel-portion holes 46. In some embodiments, the gate patterns 68 may completely fill the channel-portion holes 46. The source and drain regions 88 may overlap the gate patterns 68. That is, a portion of the source and drain regions may be formed under a portion of the gate patterns 68. Gate insulating patterns 51 may be disposed between the gate patterns 68 and the semiconductor substrate 10. Also, pad electrical nodes 98 may be disposed adjacent to the gate patterns 68. The pad electrical nodes 98 may be in contact with the source and drain regions 88 in the active region 24.

Gate spacers 70 may be disposed between the pad electrical nodes 98 and the gate patterns 68. An interlayer insulating layer 90 may be disposed on the semiconductor substrate 1 0. The interlayer insulating layer 90 covers the gate patterns 68 and the gate spacers 70 to isolate the pad electrical nodes 98. In the embodiments described above recessed transistors 100 including pad electrical nodes 98, gate patterns 68, and channel-portion holes 46 are provided.

In each of the recessed transistors 100, the channel region 28 includes not only the bottom surface of the channel-portion hole 46 but also the lateral surfaces S1 of the semiconductor substrate 10, which are exposed by the channel-portion hole 46 in the width direction of the active region 24. Accordingly, the channel region 28 may have a larger effective channel width or dimension as compared to transistors having a channel width or dimension limited to bottom surface of the channel-portion hole 46.

FIGS. 4, 6, 8, 10, 12, 14, and 16 are cross-sectional views illustrating a method of forming a transistor, taken along line I-I' of FIG. 1, respectively. And FIGS. 5, 7, 9, 11, 13, 15, and 17 are cross-sectional views, illustrating the method of forming a transistor, taken along line II-II' of FIG. 1, respectively.

Figure 4:
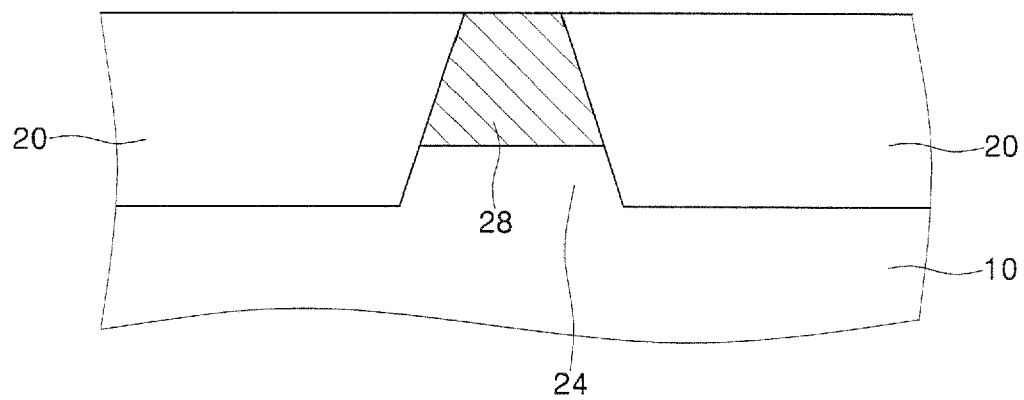
FIGS. 4, 6, 8, 10, 12, 14, and 16 are cross-sectional views illustrating a method of forming the transistor illustrated in FIG. 1, taken along line I-I' of FIG. 1.
Figure 5:
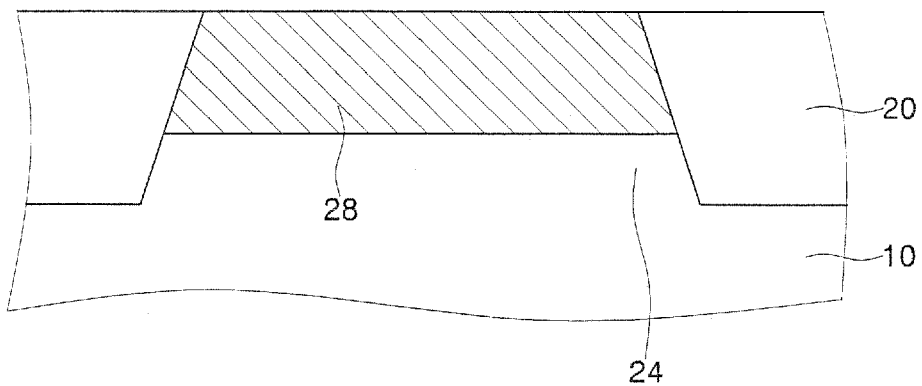
FIGS. 5, 7, 9, 11, 13, 15, and 17 are cross-sectional views, illustrating the method of forming the transistor illustrated in FIG. 1, taken along line II-II' of FIG. 1.

Referring to FIGS. 1, 4, and 5, a device isolation layer 20 is formed in a semiconductor substrate 10 to define an active region 24. The device isolation layer 20 may have a different etching ratio from the semiconductor substrate 10. A channel region 28 may be formed in the active region 24 of the semiconductor substrate 10 between the device isolation layers 20. The channel region 28 may have the same conductivity type as that of the semiconductor substrate 10. In some embodiments, the semiconductor substrate 10 may be formed with p-type impurity ions. The active region 24 may further have a cross-sectional width profile that progressively narrows towards the upper surface of the active region 24. To this end, the lateral surfaces of the active region 24 may be upwardly sloping, as shown in FIG. 2.

Figure 6:
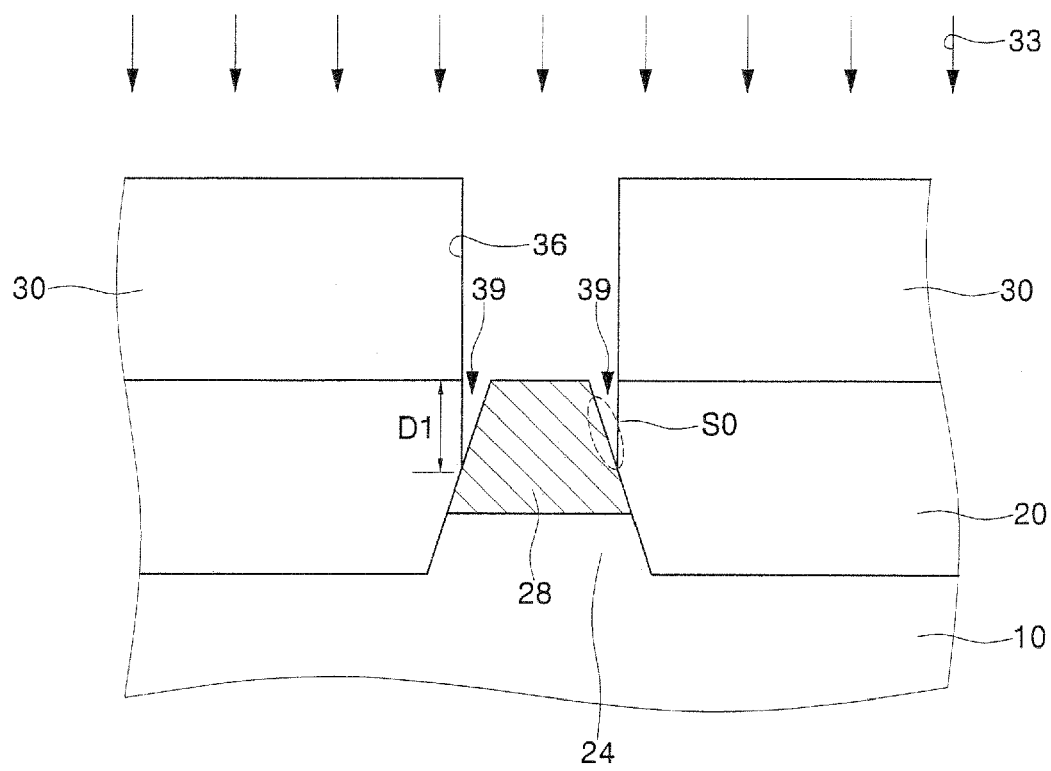
Figure 7:
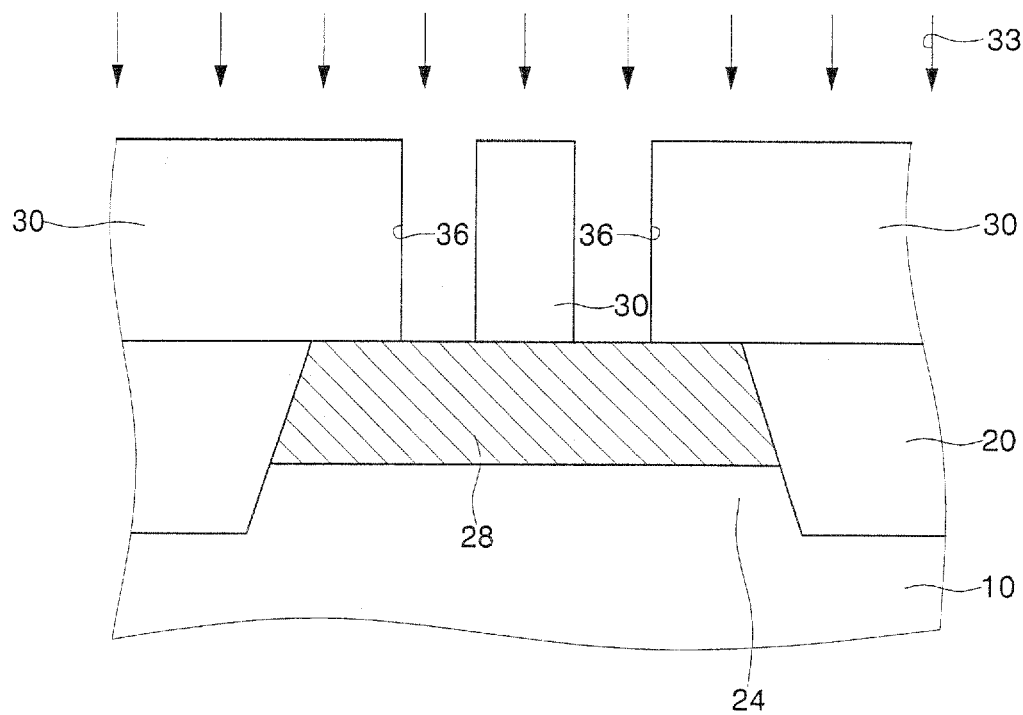

Referring to FIGS. 1, 6, and 7, a photoresist layer 30 is formed to cover the active region 24 and the device isolation layer 20. The photoresist layer 30 may be formed to include openings 36, which expose a portion of the active region 24 and a portion of the device isolation layer 20 adjacent to the sides of active region in a width direction as shown in FIGS. 6 and 7. An etching process 33 is performed on the device isolation layer 20 using the photoresist layer 30 and the semiconductor substrate 10 as an etch mask and an etch buffer layer, respectively.

During the etching process 33, the device isolation layer 20 is removed to a predetermined depth D1 from the top surface of the device isolation layer 20 toward a bottom surface thereof. As a result, portions 39 of the device isolation layer 20 are removed to expose lateral surfaces S0 of the semiconductor substrate 10 in the active region 24. In other words, the progressively narrowing cross-sectional width profile of the active region of some embodiments allows a portion of the lateral surface of the active region 24 to be exposed by the etching process 33, while another portion of the lateral surface of the active region 24 may remain in contact with the device isolation layer 20. The etching process 33 may be carried out using an anisotropic etching technique. Alternatively, the etching process 33 may be carried out using an isotropic etching technique.

Figure 8:
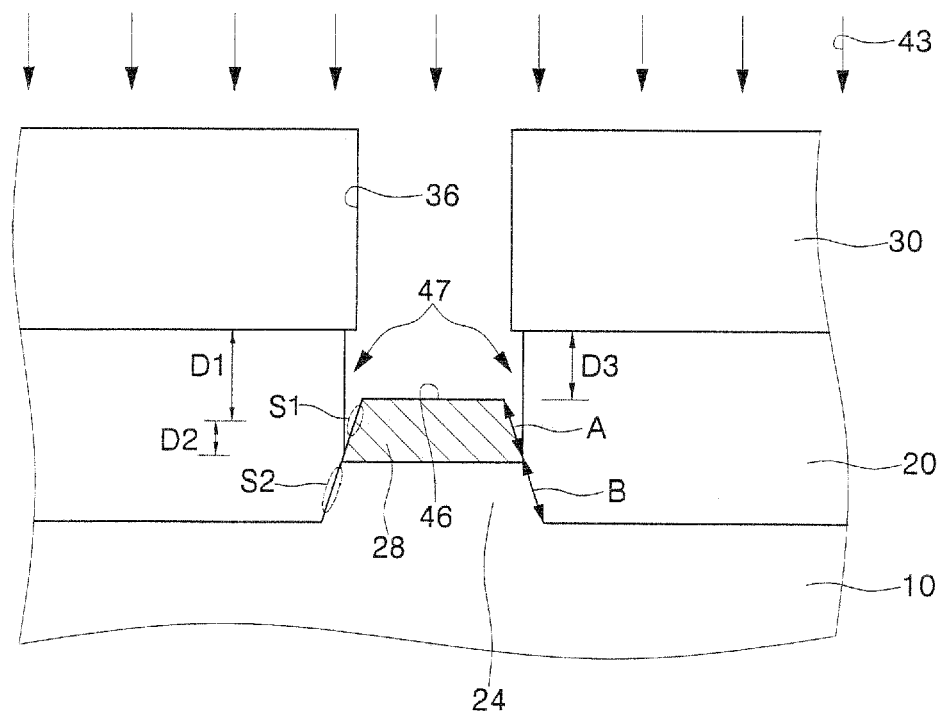
Figure 9:
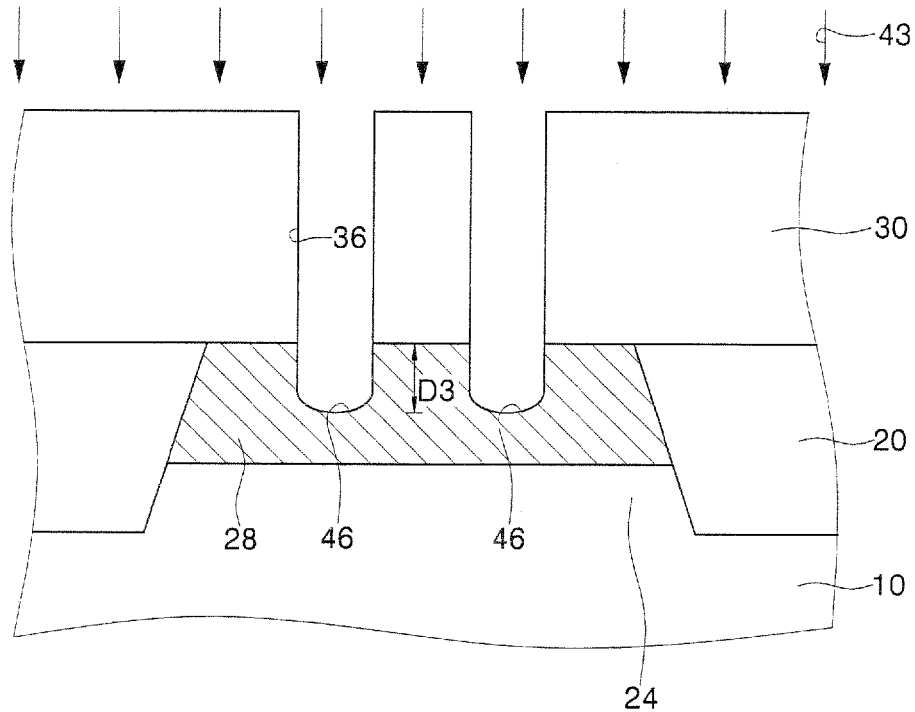

Referring to FIGS. 1, 8, and 9, another etching process 43 is performed on the semiconductor substrate 10 in the active region 24 through the opening 36, using the photoresist layer 30 and the device isolation layer 20 as an etch mask. During the etching process 43, portions 47 of the device isolation layer 20 may be sequentially removed to a predetermined depth D2. The lateral surfaces S0 of the semiconductor substrate 10 of FIG. 6 may thus be further exposed toward the bottom surface of the device isolation layer 20. Also, part of the semiconductor substrate 10 in the active region 24 is removed to a predetermined depth D3 from a top surface of the semiconductor substrate 10 toward a bottom surface thereof during the etching process 43. As a result, channel-portion holes 46 are formed in the semiconductor substrate 10 and the device isolation layer 20. The channel-portion holes 46 may be formed such that their bottom surfaces are positioned between the top and bottom surfaces of the device isolation layer 20 surrounding the active region 24. After the etching process 43, the photoresist layer 30 is removed from the semiconductor substrate 10.

After the channel-portion holes 46 are formed, the etching process 43 forms lateral surfaces S1 of the semiconductor substrate 10 in the width direction of the active region 24, as shown in FIG. 8. The lateral surfaces S1 of the semiconductor substrate 10 are formed in the channel-portion holes 46. The lateral surfaces S1 may have different dimensions from those of the lateral surfaces S0 shown in FIG. 6. Each of the lateral surfaces S1 of the semiconductor substrate 10 is formed to have a predetermined length A. The length A of the lateral surfaces S1 of the semiconductor substrate 10 may be different from a length B of lateral surfaces S2 that are connected to the lateral surfaces S1 and in contact with the device isolation layer 20. In some embodiments the length A of the lateral surfaces S1 of the semiconductor substrate 10 may be shorter than the length B of the lateral surfaces S2, while in other embodiments the length A of the lateral surfaces S1 of the semiconductor substrate 10 may be equal to or longer than the length B of the lateral surfaces S2. Thus, at least one of the lateral surfaces S1 of the semiconductor substrate 10 may be exposed by the channel-portion holes 46.

Also, the sidewall height of the channel-portion hole 46 may be greater in the width direction of the active region 24 than in the length direction thereof.

Since the portions 39 of the device isolation layer 20 (shown in FIG. 6) are removed during the etching process 33 of FIG. 6, no fences of the semiconductor substrate 10 are formed on sidewalls of the device isolation layer 20. Therefore, by making use of the lateral surfaces S1 of the semiconductor substrate 10 disposed in the channel-portion holes 46, the width of the channel region 28 can effectively be increased. If the portions 39 of the device isolation layer 20 are not removed during the etching process 33 of FIG. 6, the etching process 43 may not be able to avoid forming fences on the sidewalls of the device isolation layer 20 due to the geometrical structure between the semiconductor substrate 10 and the device isolation layer 20 in the channel-portion holes 46.

Figure 10:
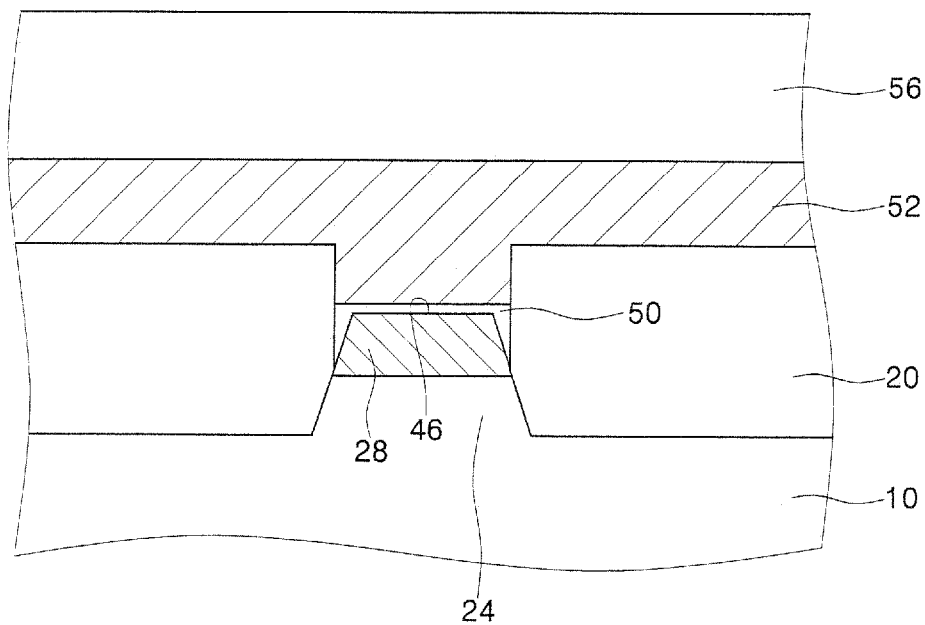
Figure 11:
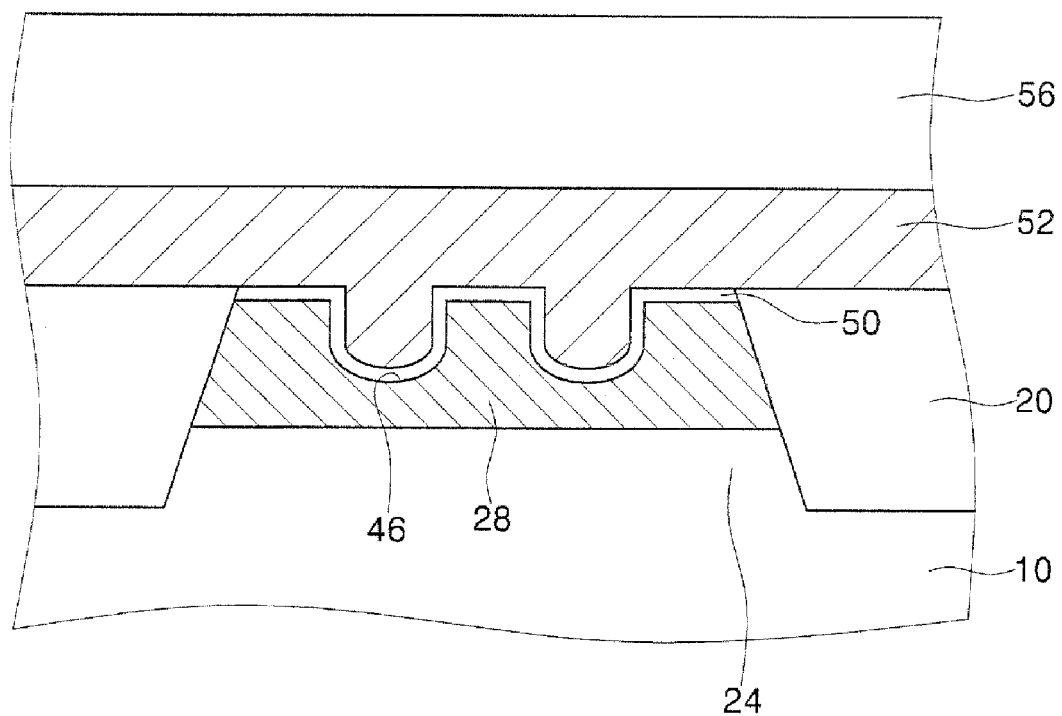

Referring to FIGS. 1, 10, and 11, a gate insulating layer 50 is formed to at least partially fill the channel-portion holes 46 and cover the active region 24 and the device isolation layer 20. A gate layer 52 and a gate capping layer 56 are sequentially formed on the gate insulating layer 50. The gate capping layer 56 may be formed of an insulating layer having a different etching ratio from the gate insulating layer 50. In some embodiments, the gate capping layer 56 may be formed of silicon nitride ($Si_3N_4$). In other embodiments, the gate capping layer 56 may be formed of silicon oxide ($SiO_2$). It is preferably that the gate layer 52 be formed by sequentially stacking a doped polysilicon layer and a metal silicide layer. The gate layer 52 may be formed by sequentially stacking an n+ polysilicon layer and a tungsten silicide (WSi) layer. Also, the gate layer 52 may be formed of only an n+ polysilicon layer. The gate insulating layer 50 may be formed of silicon oxide. It is preferably that the gate insulating layer 50 be formed on the semiconductor substrate 10 to conformally cover the channel-portion holes 46.

Figure 12:
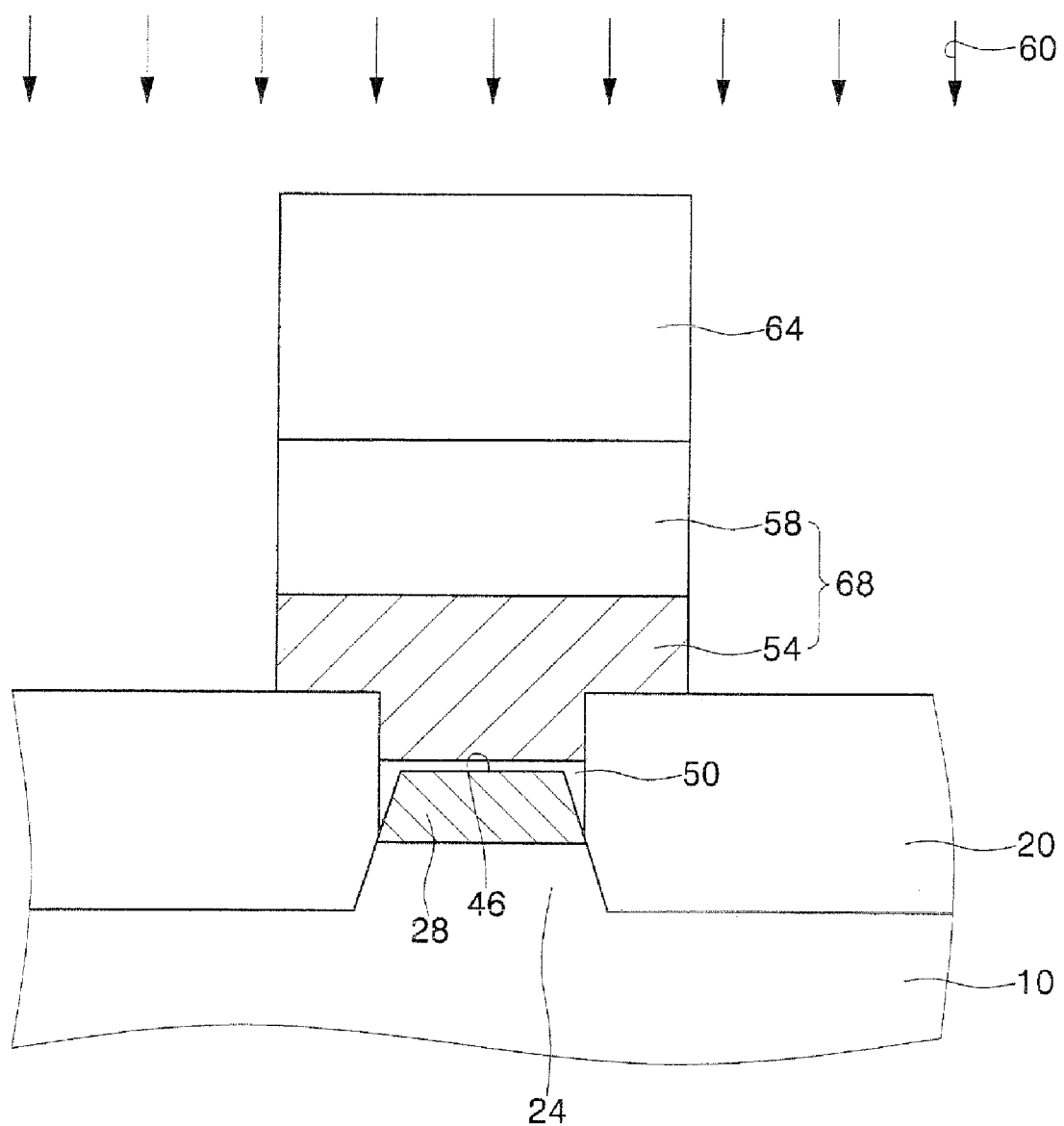
Figure 13:
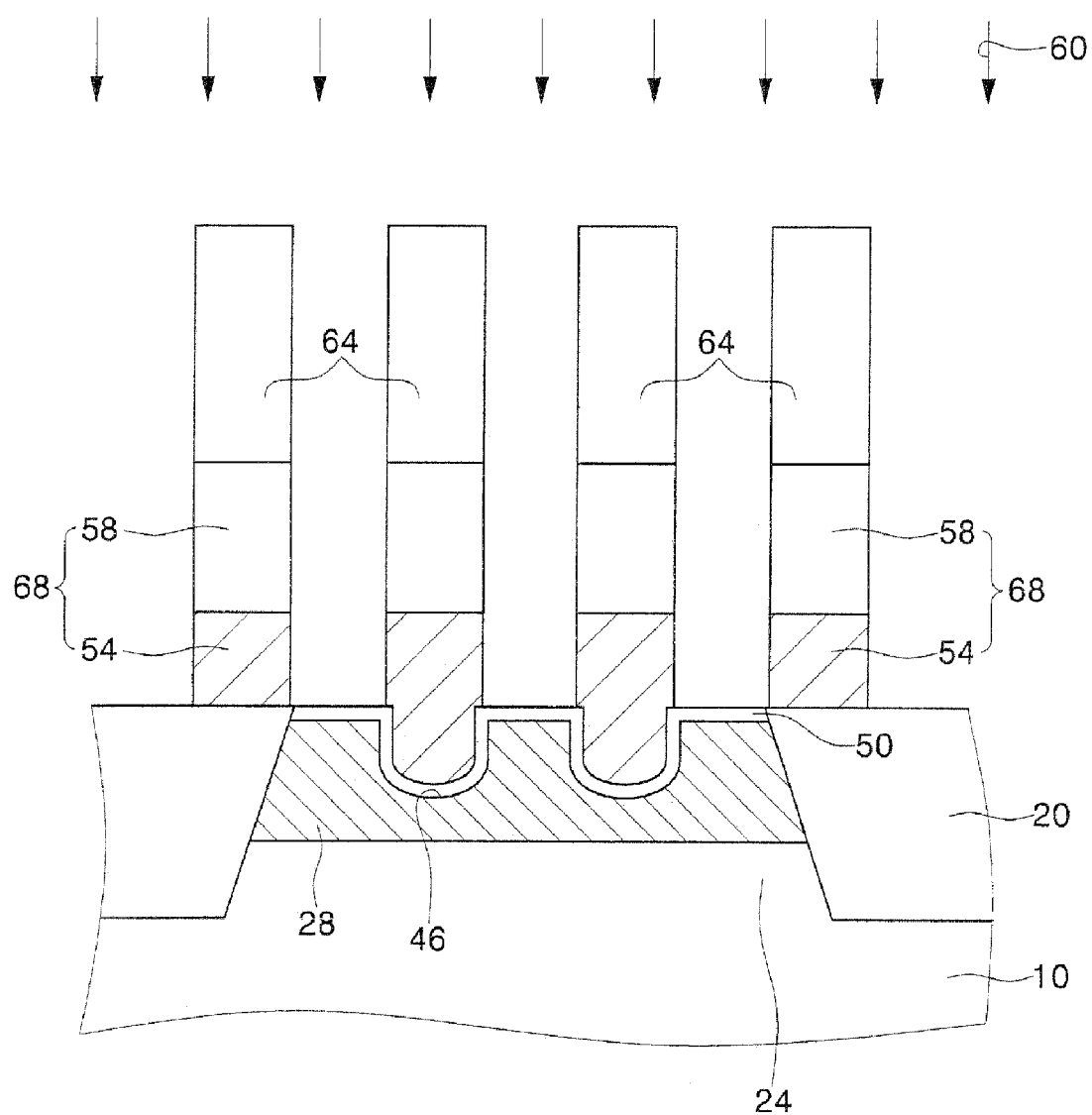

Referring to FIGS. 1, 12, and 13, photoresist patterns 64 are formed on the gate capping layer 56. Some of the photoresist patterns 64 are disposed on the active region 24 to overlap the channel-portion holes 46. Also, the remaining photoresist patterns 64 are disposed on the device isolation layer 20 at the ends (in the length direction) of the active region 24 such that they are adjacent to some photoresist patterns 64 on the active region 24.

An etching process 60 is sequentially performed on the gate capping layer 56 and the gate layer 52 using the photoresist patterns 64 and the gate insulating layer 50 as an etch mask and an etch buffer layer. As a result, gate patterns 68 are formed on the gate insulating layer 50. Each of the gate patterns 68 may include a gate electrode 54 and a gate capping pattern 58, which are sequentially stacked. In this case, some of the gate patterns 68 may at least partially fill in the channel-portion holes 46, and are formed to protrude from the top surface of the semiconductor substrate 10. Also, the remaining gate patterns 68 are disposed on the device isolation layer 20 such that they are adjacent to some gate patterns 68 filling the channel-portion holes 46.

Each of the gate patterns 68 in the channel-portion holes 46 can make use of the bottom surface of the channel-portion hole 46 and the lateral surface S1 of the semiconductor substrate 10 in the active region 24 as the channel region 28.

Figure 14:
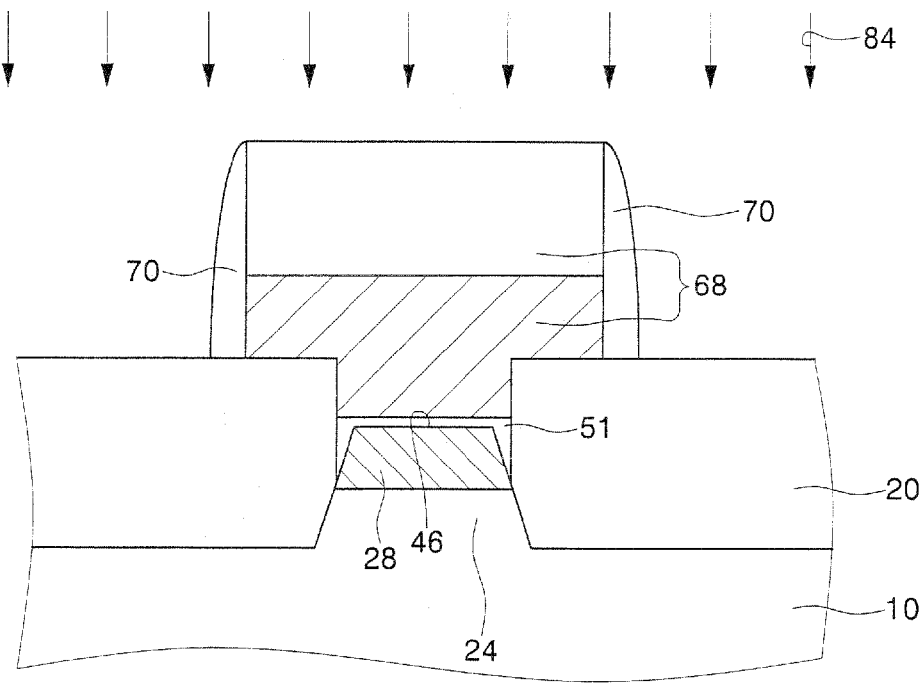
Figure 15:
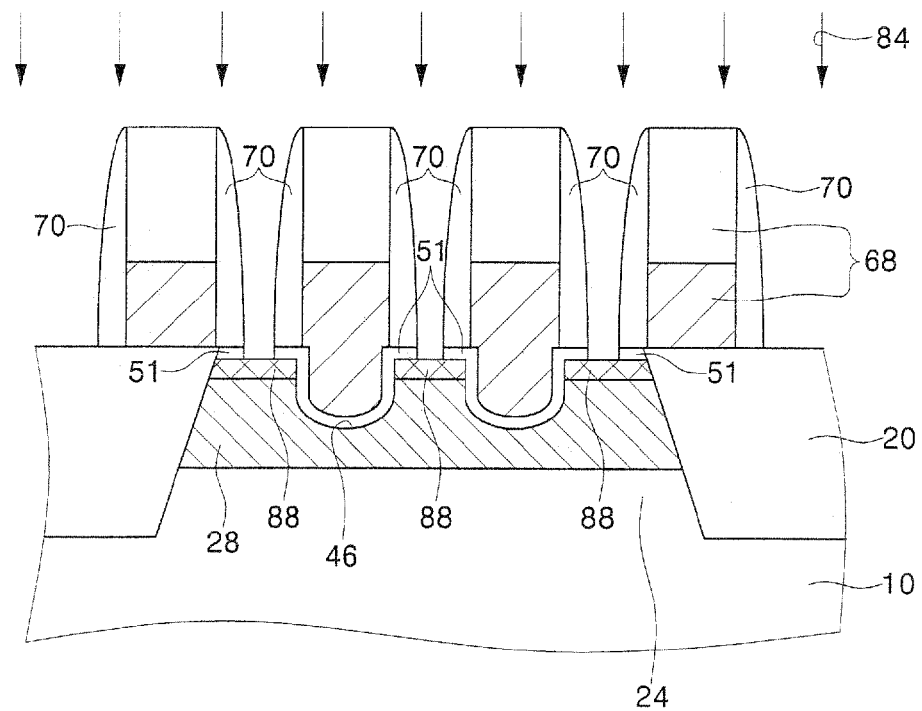

Referring to FIGS. 1, 14, and 15, gate spacers 70 may be formed on sidewalls of the gate patterns 68. The gate spacers 70 may be formed of an insulating layer having the same etching ratio as the gate capping patterns 58. In this case, the gate spacers 70 expose the active region 24 of the semiconductor substrate 10, thereby forming gate insulating patterns 51. Further, the gate spacers 70 may be formed on the gate insulating patterns 51. In this process, the gate insulating patterns 51 may be formed between the active region 24 and some of the gate patterns 68, and between the remaining gate patterns 68 and the device isolation layer 20.

An ion implantation process 84 may be performed on the active region 24 of the semiconductor substrate 10 using the gate patterns 68, the gate spacers 70, and the device isolation layer 20 as a mask. During the performance of the ion implantation process 84, source and drain regions 88 are formed in the active region 24 of the semiconductor substrate 10. The source and drain regions 88 are formed adjacent to the channel-portion holes 46 and may overlap the gate patterns 68. The source and drain regions 88 may have a different conductivity type from the channel region 28.

Figure 16:
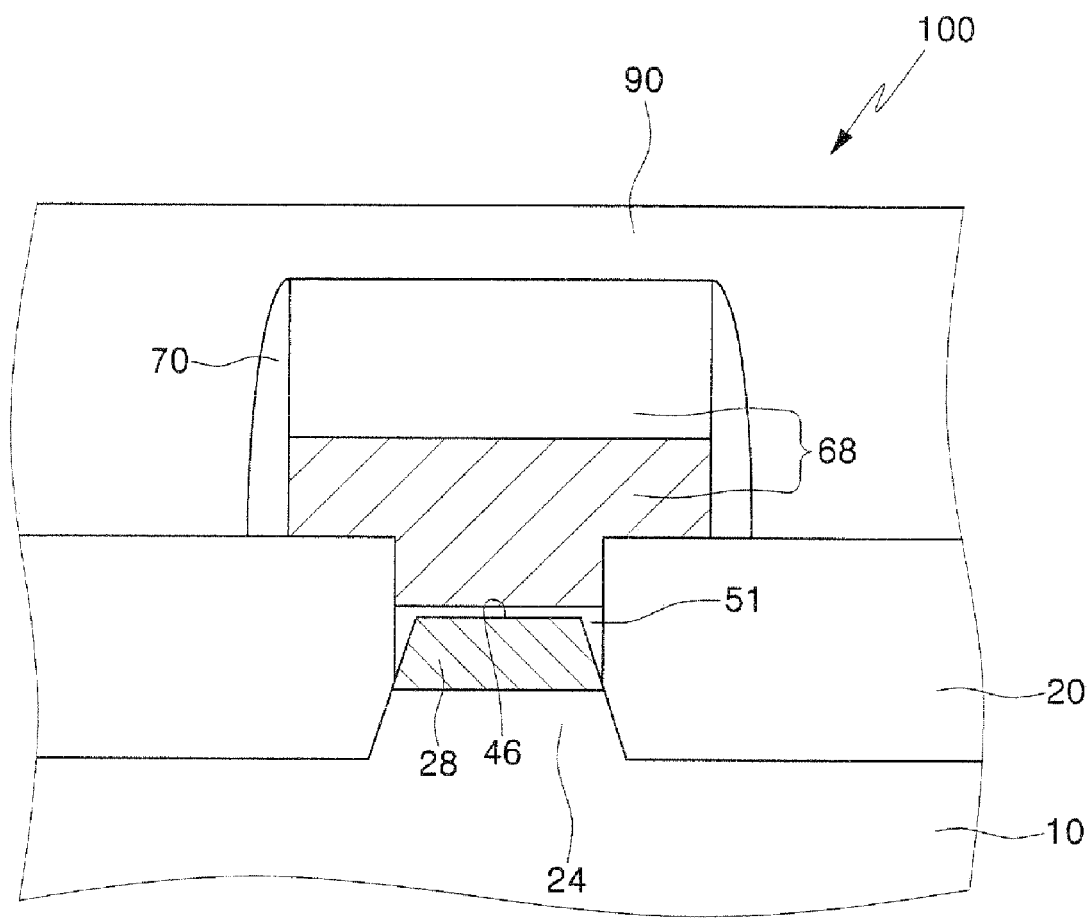
Figure 17:
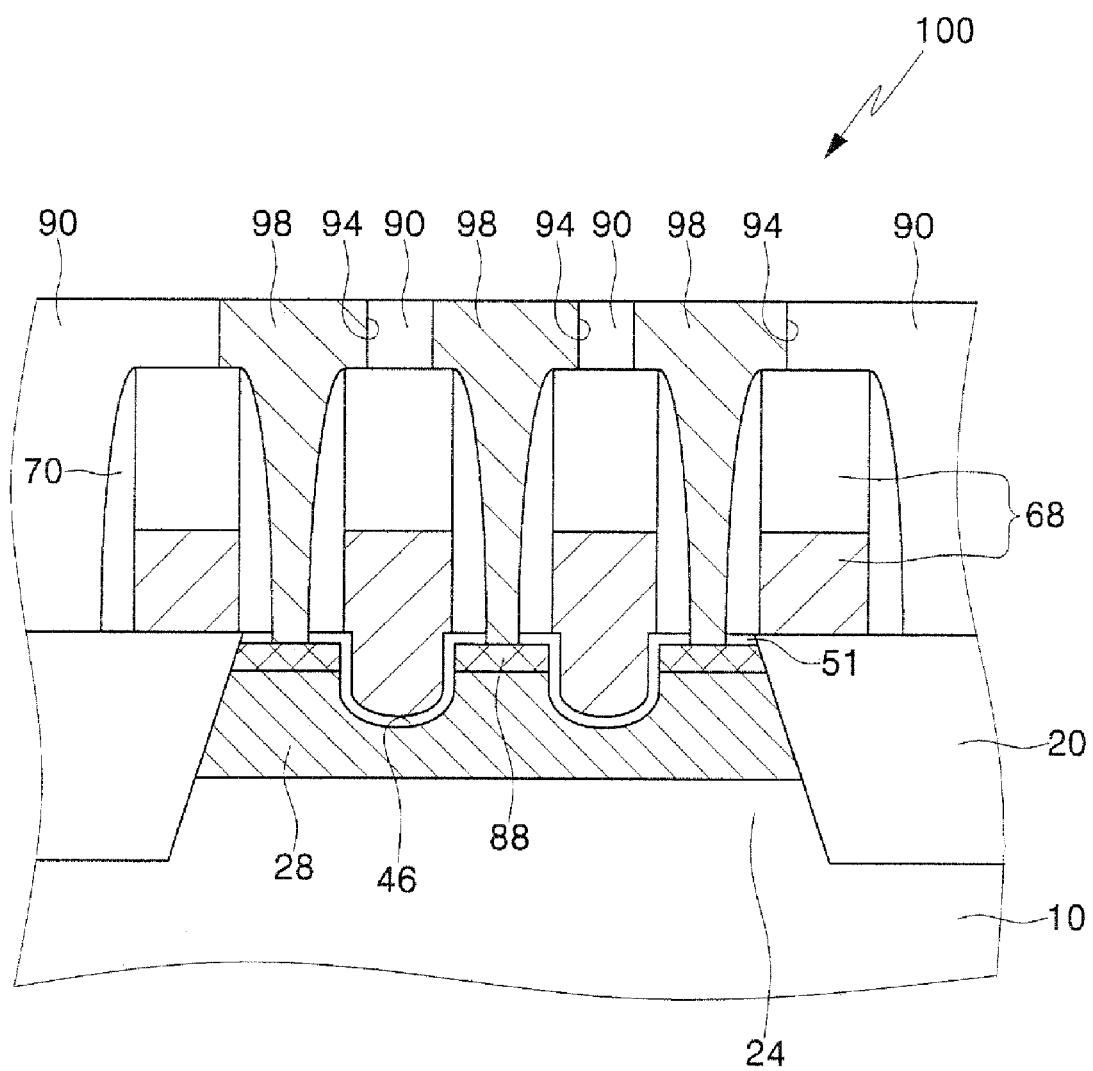

Referring to FIGS. 1, 16, and 17, an interlayer insulating layer 90 may be formed on the semiconductor substrate 10 to cover the gate patterns 68 and the gate spacers 70. The interlayer insulating layer 90 may be formed of an insulating layer having a different etch rate from the gate capping patterns 58. The interlayer insulating layer 90 may be formed of silicon oxide.

Node holes 94 may be formed between the gate patterns 68 through predetermined regions of the interlayer insulating layer 90. The node holes 94 may be surrounded with the interlayer insulating layer 90 and isolated from one another. The node holes 94 may be filled with pad electrical nodes 98. The pad electrical nodes 98 may be formed of a conductive layer. The pad electrical nodes 98 may be in contact with the source and drain regions 88, respectively. In this process, recessed transistors 100 including the pad electrical nodes 98, the source and drain regions 88, the gate patterns 68, and the channel-portion holes 46 can be formed.

As described above, embodiments of the present invention provide recessed transistors without semiconductor substrate fences formed on the sidewalls of a device isolation layer and methods of forming the same. According to the present invention, the fences of the semiconductor substrate in channel-portion holes are removed so that no parasitic transistor is formed in a width direction of an active region and current driving capability can be maximized.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device comprising:
    forming a device isolation layer in a semiconductor substrate to isolate an active region;
    performing a first etching process to etch a first portion of the device isolation layer; and
    performing a second etching process to etch a portion of the semiconductor substrate in the active region and a second portion of the device isolation layer to form a channel-portion hole in the active region, wherein the device isolation layer is etched to expose a first lateral surface of the semiconductor substrate in the active region.

2. The method according to claim 1, further comprising:
sequentially forming a gate layer and a gate capping layer to fill the channel-portion hole and cover the active region and the device isolation layer;
    forming a photoresist pattern on the gate capping layer to overlap the channel-portion hole; and
    sequentially etching the gate capping layer and the gate layer using the photoresist pattern as an etch mask to form a gate pattern.

3. The method according to claim 2, further comprising:
    forming source and drain regions in the active region to overlap the gate pattern;
    forming an interlayer insulating layer over the gate pattern;
    forming node holes adjacent to both sidewalls of the gate pattern, respectively, through the interlayer insulating layer; and
    filling the node holes with conductive nodes.

4. The method according to claim 1, wherein etching the device isolation layer during the first etching process comprises partially removing the device isolation layer adjacent to the semiconductor substrate in the active region.

5. The method according to claim 1, wherein etching the device isolation layer comprises using an anisotropic etching technique.

6. The method according to claim 1, wherein etching the device isolation layer comprises using an isotropic etching technique.

7. The method according to claim 1, wherein etching the device isolation layer during the second etching process comprises removing the device isolation layer adjacent to the semiconductor substrate in the active region.

8. The method of claim 1, further comprising:
    forming a photoresist layer having an opening to expose both the active region and the device isolation layer before performing a first etching process;
    using the photoresist layer having the opening and the semiconductor substrate during the first etching process as an etch mask and an etch buffer layer, respectively;
    using the photoresist layer having the opening as an etch mask during the second etching process; and
    removing the photoresist layer having the opening after performing the second etching process.

9. A semiconductor device comprising:
    a device isolation layer formed in a semiconductor substrate to define an active region; and
    at least one channel-portion hole formed in the active region, the channel-portion hole extending in a downward direction from a top surface of the active region, wherein the active region in the channel-portion hole includes at least one first lateral surface separated from the device isolation layer, wherein portions of the isolation layer are removed to a predetermined depth.

10. The semiconductor device according to claim 9, wherein the active region further comprises at least one second lateral surface connected to the first lateral surface and in contact with the device isolation layer.

11. The semiconductor device according to claim 10, wherein the length of the first lateral surface is shorter than the length of the second lateral surface.

12. The semiconductor device according to claim 10, wherein the length of the first lateral surface is longer than the length of the second lateral surface.

13. The semiconductor device according to claim 9, wherein the width of the semiconductor substrate at the bottom of the channel-portion hole is longer than the length of the first lateral surface.

14. The semiconductor device according to claim 9, wherein the width of the semiconductor substrate at the bottom of the channel-portion hole is equal to the length of the first lateral surface.

15. The semiconductor device according to claim 9, wherein the width of the semiconductor substrate at the bottom of the channel-portion hole is shorter than the length of the first lateral surface.

16. The semiconductor device according to claim 9, further comprising:
    a gate pattern disposed on the semiconductor substrate to at least partially fill the channel-portion hole; and
    pad electrical nodes disposed adjacent to both sidewalls of the gate pattern, respectively, wherein the pad electrical nodes are electrically connected to the active region.

17. A semiconductor device comprising:
    a device isolation layer formed in a semiconductor substrate to define an active region;
    at least one channel-portion hole formed to a particular depth in the active region, wherein the active region at the bottom of the channel-portion hole includes upward sloping lateral surfaces, the upward sloping lateral surfaces include at least one first lateral surface separated from the device isolation layer, and at least one second lateral surface connected to the first lateral surface and in contact with the device isolation layer, wherein portions of the isolation layer are removed to a predetermined depth;
    a source region and a drain region formed in the active region on opposite sides of the channel-portion hole, respectively;
    a gate insulating pattern formed in the channel portion hole; and
    at least one gate pattern formed over the channel-potion hole.

18. The semiconductor device of claim 17, wherein two channel-portion holes are formed in the active region.

19. The semiconductor device of claim 17, wherein the gate insulating pattern is formed between the first lateral surface of the semiconductor substrate in the channel-portion hole and the device isolation layer.

20. The semiconductor device of claim 17, wherein the length of the first lateral surface of the active region in the channel-portion hole is longer than the second lateral surface of the active region under the channel-portion hole.

21. The semiconductor device of claim 17, wherein the length of the first lateral surface of the active region in the channel-portion hole is shorter than the second lateral surface of the active region under the channel-portion hole.

22. The semiconductor device of claim 17, wherein the length of the first lateral surface of the active region in the channel-portion hole is equal to the second lateral surface of the active region under the channel-portion hole.

23. The semiconductor device of claim 17, wherein the active region at the bottom of the channel-portion hole includes a cross-sectional profile that progressively narrows towards a top surface of the active region.

* * * * *

UNITED STATES PATENT AND TRADEMARK OFFICE
CERTIFICATE OF CORRECTION

PATENT NO. : 7,351,625 B2
APPLICATION NO. : 11/380470
DATED : April 1, 2008
INVENTOR(S) : Gyong-Sub Im It is certified that error appears in the above-identified patent and that said Letters Patent is hereby corrected as shown below:

Column 3, line 63, the word "1 0." should read -- 10. --.

Signed and Sealed this

Fourth Day of November, 2008

JON W. DUDAS
*Director of the United States Patent and Trademark Office*